United States Patent
Sung et al.

(10) Patent No.: US 12,362,004 B2
(45) Date of Patent: Jul. 15, 2025

(54) SCALED 2T DRAM

(71) Applicant: INTERNATIONAL BUSINESS MACHINES CORPORATION, Armonk, NY (US)

(72) Inventors: Min Gyu Sung, Latham, NY (US); Julien Frougier, Albany, NY (US); Ruilong Xie, Niskayuna, NY (US); Chanro Park, Clifton Park, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 18/320,234

(22) Filed: May 19, 2023

(65) Prior Publication Data

US 2024/0386943 A1     Nov. 21, 2024

(51) Int. Cl.
| | | |
|---|---|---|
| G11C 7/00 | (2006.01) | |
| G11C 11/4096 | (2006.01) | |
| H01L 23/522 | (2006.01) | |
| H01L 23/528 | (2006.01) | |
| H10B 12/00 | (2023.01) | |
| H10D 30/01 | (2025.01) | |

(Continued)

(52) U.S. Cl.
CPC ...... *G11C 11/4096* (2013.01); *H01L 23/5226* (2013.01); *H01L 23/5283* (2013.01); *H10B 12/05* (2023.02); *H10B 12/30* (2023.02); *H10D 30/014* (2025.01); *H10D 30/43* (2025.01); *H10D 30/6729* (2025.01); *H10D 30/6755* (2025.01); *H10D 30/6757* (2025.01); *H10D 62/121* (2025.01)

(58) Field of Classification Search
CPC .... G11C 11/4096; H10B 12/05; H10B 12/30; H10D 30/014; H10D 30/6757; H10D 30/6755; H10D 30/43; H10D 30/6729; H01L 23/5226; H01L 23/5283
USPC .................................................. 365/189.011
See application file for complete search history.

(56) References Cited

U.S. PATENT DOCUMENTS

| | | |
|---|---|---|
| 7,241,655 B2 | 7/2007 | Tang |
| 7,491,995 B2 | 2/2009 | Forbes |

(Continued)

FOREIGN PATENT DOCUMENTS

EP          3719847 A1     10/2020

OTHER PUBLICATIONS

Belmonte et al., "Capacitor-less, long-retention (> 400s) DRAM Cell Paving the Way towards Low-Power and High-Density Monolithic 3D DRAM", 2020 IEEE International Electron Devices Meeting (IEDM), pp. 28.2.1-28.2.4.

(Continued)

*Primary Examiner* — Viet Q Nguyen
(74) *Attorney, Agent, or Firm* — Yuanmin Cai

(57) ABSTRACT

Embodiments of present invention provide a semiconductor structure. The semiconductor structure includes a dynamic random-access-memory (DRAM), and the DRAM includes a vertical transistor and a nanosheet transistor, the vertical transistor being stacked on top of the nanosheet transistor, where a bottom source/drain of the vertical transistor is directly above and connected to a gate of the nanosheet transistor through a conductive via. A method of manufacturing the semiconductor structure is also provided.

18 Claims, 15 Drawing Sheets

(51) Int. Cl.
*H10D 30/43* (2025.01)
*H10D 30/67* (2025.01)
*H10D 62/10* (2025.01)

(56) References Cited

U.S. PATENT DOCUMENTS

| | | | |
|---|---|---|---|
| 9,502,407 B1 | 11/2016 | Anderson | |
| 9,991,170 B2 | 6/2018 | Anderson | |
| 10,014,390 B1* | 7/2018 | Bouche | H10D 30/6757 |
| 10,651,291 B2* | 5/2020 | Frougier | H10D 62/116 |
| 10,748,901 B2* | 8/2020 | Rubin | H10D 30/024 |
| 11,011,647 B2 | 5/2021 | Sandhu | |
| 11,502,167 B2* | 11/2022 | Hong | H10D 84/017 |
| 11,557,659 B2* | 1/2023 | Wang | H10D 62/151 |
| 11,605,740 B2* | 3/2023 | Van Dal | H10B 63/30 |
| 11,653,492 B2* | 5/2023 | Chang | H10B 20/20 257/530 |
| 11,881,435 B2* | 1/2024 | Sreenivasan | G02B 6/1223 |
| 12,176,411 B2* | 12/2024 | Liaw | H10D 84/0188 |
| 2022/0320180 A1* | 10/2022 | Liu | H10D 30/014 |
| 2023/0019692 A1* | 1/2023 | Gardner | H10B 12/05 |
| 2023/0114024 A1* | 4/2023 | Gardner | H10D 88/00 257/401 |
| 2024/0202305 A1* | 6/2024 | Cheng | G06F 21/73 |

OTHER PUBLICATIONS

IMEC, "IMEC Demonstrates Capacitor-less IGZO-Based DRAM Cell With >400s Retention Time", Press Release, https://www.imec-int.com/en/press/imec-demonstrates-capacitor-less-igzo-based-dram-cell-400s-retention-time, Dec. 15, 2020, 16 pages.

* cited by examiner

SCALED 2T DRAM

BACKGROUND

The present application relates to manufacturing of semiconductor integrated circuits. More particularly, it relates to a dynamic random-access-memory device and method of manufacturing the same.

Memory devices are crucially important in advanced technology node in their role of management and storage of information represented by data. Typical memory devices include dynamic random-access-memory (DRAM), static random-access-memory (SRAM), and various types of magnetoresistive random-access-memory (MRAM).

DRAM is a type of random-access semiconductor memory that stores each bit of data in a memory cell, usually having a tiny capacitor and a transistor for the storage of electric charge thereby storage of a bit of either "1" or "0". It is known that the electric charge on the capacitors may gradually leak away due to leakage current. Without intervention, the data on the capacitor would eventually be lost after a certain period of time. To prevent this loss, DRAM requires an external memory refresh circuit which periodically rewrites the data in the capacitors and/or transistors, restoring them to their original level of charge. Some important criteria measuring performance of a DRAM device may include, for example, high capacitor capacitance and low leakage current for long retention time, low-power consumption for refresh circuitry, and small footprint for application in high-density integrated circuits.

SUMMARY

Embodiments of present invention provide a memory device. The memory device includes a vertical transistor and a nanosheet transistor, the vertical transistor being stacked on top of the nanosheet transistor, where a bottom source/drain of the vertical transistor is directly above and connected to a gate of the nanosheet transistor through a conductive via.

In one embodiment, the channel region of the vertical transistor includes indium-gallium-zinc-oxide (IGZO). In one aspect, the IGZO in the channel region is horizontally surrounded by a metal gate via a layer of gate oxide.

In another embodiment, the vertical transistor is a write-transistor and the nanosheet transistor is a read-transistor, and the write-transistor and the read-transistor form a dynamic random-access-memory (DRAM). In one aspect, a top source/drain of the vertical transistor is connected to a write-bit-line, and the metal gate of the vertical transistor is connected to a write-word-line.

In yet another embodiment, the nanosheet transistor has a dimension measured from a first source/drain region to a second source/drain region, and where the channel region of the vertical transistor is horizontally smaller than the dimension of the nanosheet transistor.

In one embodiment, the nanosheet transistor has three or more nanosheets. In another embodiment, the channel region of the vertical transistor has a vertical length that is equal to or larger than 10 nm.

Embodiments of present invention further provides a method of forming a semiconductor structure. The method includes forming a nanosheet transistor; flipping the nanosheet transistor upside-down; and forming a vertical transistor on top of the nanosheet transistor, where a bottom source/drain of the vertical transistor is connected to a gate of the nanosheet transistor.

In one embodiment, forming the vertical transistor includes removing a substrate upon which the nanosheet transistor is formed until an etch-stop layer is exposed; depositing a dielectric layer on top of the etch-stop layer; creating an opening in the dielectric layer and the etch-stop layer to expose the gate of the nanosheet transistor; and forming a conductive via in the opening to contact the gate of the nanosheet transistor.

In another embodiment, forming the vertical transistor further includes forming a stack of layers on top of the dielectric layer and the conductive via; and patterning the stack of layers into the bottom source/drain, a channel region, and a top source/drain of the vertical transistor.

In yet another embodiment, forming the vertical transistor further includes forming a gate dielectric horizontally surrounding the channel region; and forming a metal gate horizontally surrounding the channel region and the gate dielectric, where the channel region includes indium-gallium-zinc-oxide (IGZO).

In one embodiment, patterning the stack of layers includes forming the bottom source/drain, the channel region, and the top source/drain to have a horizontal dimension that is smaller than a dimension of the nanosheet transistor, the dimension of the nanosheet transistor being measured from a first source/drain region to a second source/drain region of the nanosheet transistor.

BRIEF DESCRIPTION OF THE DRAWINGS

The present invention will be understood and appreciated more fully from the following detailed description of embodiments of present invention, taken in conjunction with accompanying drawings of which.

Figure 1:
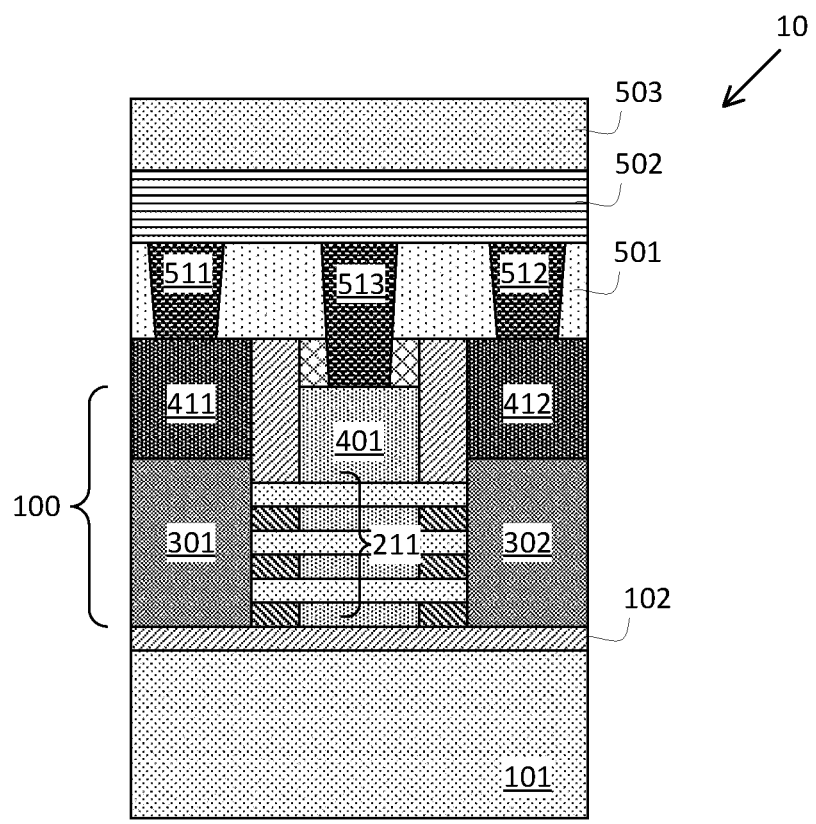
FIGS. 1-14 are demonstrative illustrations of cross-sectional views of a semiconductor structure during a process of manufacturing thereof according to embodiments of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a semiconductor structure in a step of manufacturing thereof according to one embodiment of present invention. More specifically, embodiments of present invention provide forming a semiconductor structure 10 by first forming a nanosheet transistor 100. The nanosheet transistor 100 may be formed on top of a semiconductor substrate 101 with an etch-stop layer 102 between the nanosheet transistor 100 and the semiconductor substrate 101. The etch-stop layer 102 may be used in facilitating a later process of forming a vertical transistor from underneath the nanosheet transistor 100. The nanosheet transistor 100 may include a set of nanosheets 211, a metal gate 401 surrounding the set of nanosheets 211, and a first and a second source/drain region 301 and 302 at the two ends of the metal gate 401 that surrounds the set of nanosheets 211. In one embodiment, the set of nanosheets 211 may include three or more nanosheets in order to increase the gate capacitance as a part of a DRAM device. A first and a second source/drain contact 411 and 412 may be formed to be in contact with the first and the second source/drain region 301 and 302.

Embodiments of present invention further provide forming a dielectric layer 501 on top of the nanosheet transistor 100; and forming one or more conductive vias such as conductive vias 511, 512, and 513 in the dielectric layer 501, to contact the metal gate 401 and the first and the second source/drain contact 411 and 412 of the nanosheet transistor 100. In some embodiment, one or more of the conductive vias 511, 512 and 513 may be conductive trenches. A frontside interconnect 502 may be formed on top of the dielectric layer 501. The frontside interconnect 502 may provide electronic connections to the conductive vias 511, 512, and 513, thus provide conductive accesses to the metal gate 401 and the first and the second source/drain contact 411 and 412 of the nanosheet transistor 100. In some embodiments, the frontside interconnect 502 may be a back-end-of-line (BEOL) structure. Before proceeding further, embodiments of present invention provide attaching a carrier wafer 503 to the frontside interconnect 502 by, for example, bonding the carrier wafer 503 to the structure 10 under manufacturing.

Figure 2:
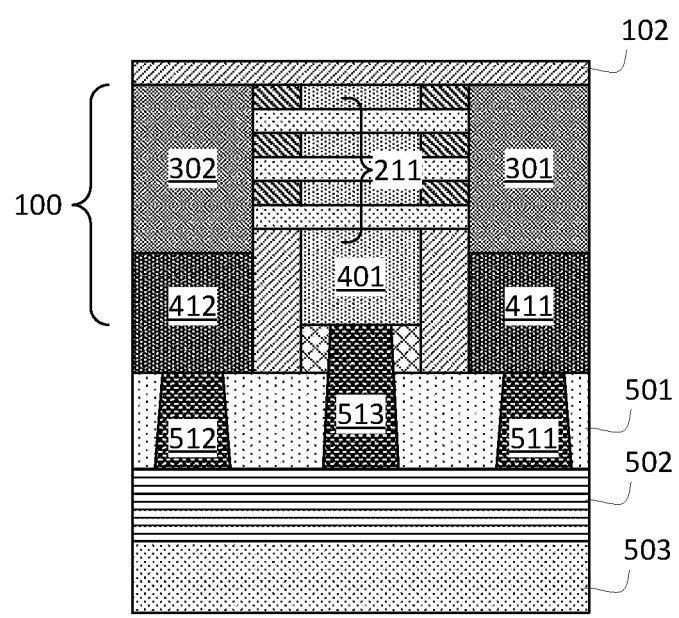

FIG. 2 is a demonstrative illustration of cross-sectional view of a semiconductor structure in a step of manufacturing thereof according to one embodiment of present invention. More specifically, following the step illustrated in FIG. 1, embodiments of present invention provide flipping the semiconductor structure 10 upside-down for continued processing from underneath the nanosheet transistor 100. For example, in order to access the nanosheet transistor 100, embodiments of present invention provide removing the semiconductor substrate 101 through, for example, a grinding process, a chemical-mechanical-polishing (CMP) process, and/or a selective etching process. The removal of the semiconductor substrate 101 may be a selective removal process which may stop at the etch-stop layer 102. In other words, embodiments of present invention provide using the etch-stop layer 102 to help control of the removal process of the semiconductor substrate 101.

Figure 3:
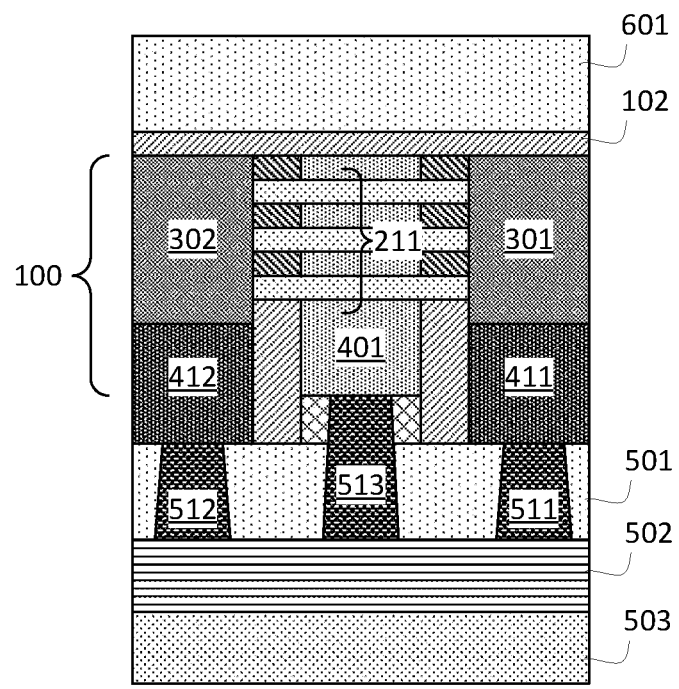

FIG. 3 is a demonstrative illustration of cross-sectional view of a semiconductor structure in a step of manufacturing thereof according to one embodiment of present invention. More specifically, following the step illustrated in FIG. 2, embodiments of present invention provide forming, for example through deposition, a dielectric layer 601 on top of the etch-stop layer 102. The dielectric layer 601 may be formed such that via and/or trench contacts may be formed in the dielectric layer 601 to contact the metal gate 401 and/or the first and the second source/drain region 301 and 302 of the nanosheet transistor 100.

Figure 4:
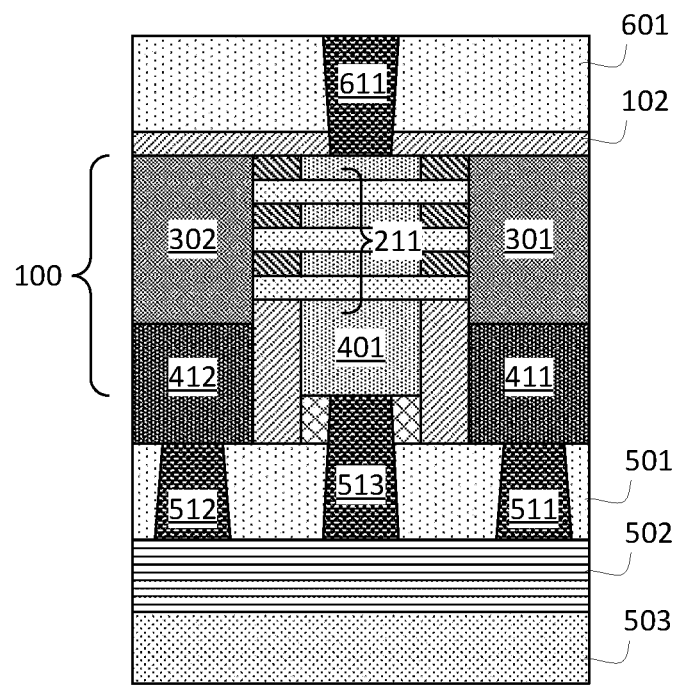

FIG. 4 is a demonstrative illustration of cross-sectional view of a semiconductor structure in a step of manufacturing thereof according to one embodiment of present invention. More specifically, following the step illustrated in FIG. 3, embodiments of present invention provide creating an opening in the dielectric layer 601 and the etch-stop layer 102 with the opening exposing the metal gate 401 of the nanosheet transistor 100; and forming a conductive via 611 in the opening to contact the metal gate 401 of the nanosheet transistor 100. The conductive via 611 may include or be made of, for example, copper (Cu), tungsten (W), titanium (Ti), tantalum (Ta), or other conductive materials.

Figure 5:
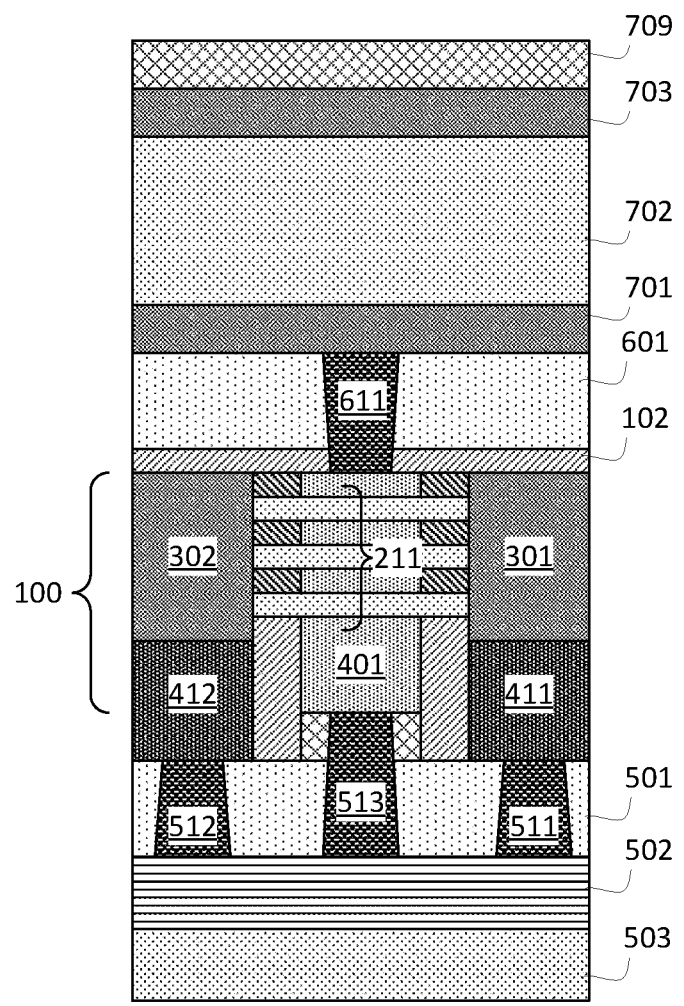

FIG. 5 is a demonstrative illustration of cross-sectional view of a semiconductor structure in a step of manufacturing thereof according to one embodiment of present invention. More specifically, following the step illustrated in FIG. 4, embodiments of present invention provide forming a stack of layers on top of the dielectric layer 601 and the conductive via 611 in forming a vertical transistor. The stack of layers may include, for example, a first semiconductor layer 701; a channel layer 702 on top of the first semiconductor layer 701; and a second semiconductor layer 703 on top of the channel layer 702. In one embodiment, the channel layer 702 may be a layer of indium-gallium-zinc-oxide (IGZO), which may be used to achieve a low leakage current of the vertical transistor formed therefrom. The channel layer 702 of IGZO material may be formed to have a sufficient thickness, for example around 10 nm to 500 nm, such that the vertical transistor formed therefrom may have a long retention time to be used as part of a DRAM structure. The first and second semiconductor layers 701 and 703 may be layers of silicon (Si), silicon-germanium (SiGe), or other material that are suitable for forming source/drain of the vertical transistor. Next, a hard mask layer 709 may be formed on top of the second semiconductor layer 703 to be used for patterning the structure of the vertical transistor.

Figure 6:
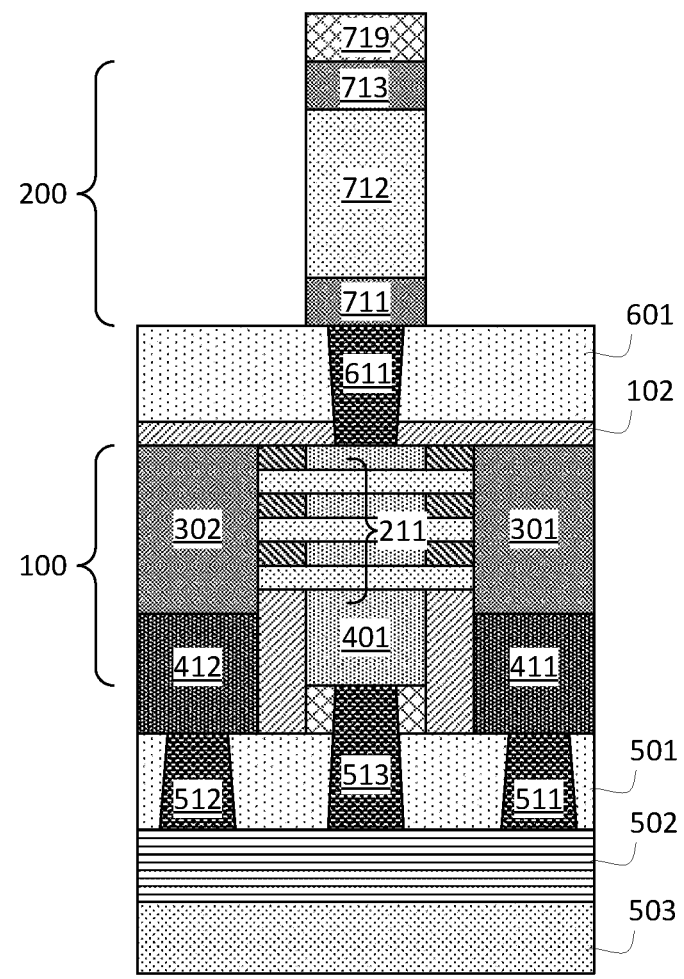

FIG. 6 is a demonstrative illustration of cross-sectional view of a semiconductor structure in a step of manufacturing thereof according to one embodiment of present invention. More specifically, following the step illustrated in FIG. 5, embodiments of present invention provide forming a hard mask 719 from the hard mask layer 709, and subsequently transferring the pattern of the hard mask 719 onto the stack of layers above the dielectric layer 601 through a directional etching process. More particularly, the pattern of the hard mask 719 may be transferred to the first semiconductor layer 701 to form a bottom source/drain 711, to the channel layer 702 to form a channel region 712, and to the second semiconductor layer 703 to form a top source/drain 713 of a vertical transistor 200. The bottom source/drain 711 may be formed directly on top of the conductive via 611 thereby in contact with the metal gate 401 of the nanosheet transistor 100.

In one embodiment, the bottom source/drain 711, the channel region 712, and the top source/drain region 713 may have a horizontal dimension that is less than a horizontal dimension of the nanosheet transistor 100, which is measured from the first source/drain region 301 to the second source/drain region 302 of the nanosheet transistor 100. By forming the vertical transistor 200 to have a horizontal dimension that is smaller than the dimension of the nanosheet transistor 100 underneath thereof, embodiments of present invention enables the manufacturing of a DRAM that has a significantly reduce footprint than a conventional DRAM where two transistors are normally placed side-by-side. Moreover, embodiments of present invention enables forming the bottom source/drain of the vertical transistor 200 to be in contact with the metal gate 401 of the nanosheet transistor 100. This vertical connection helps effectively reduce the device area as well.

Figure 7:
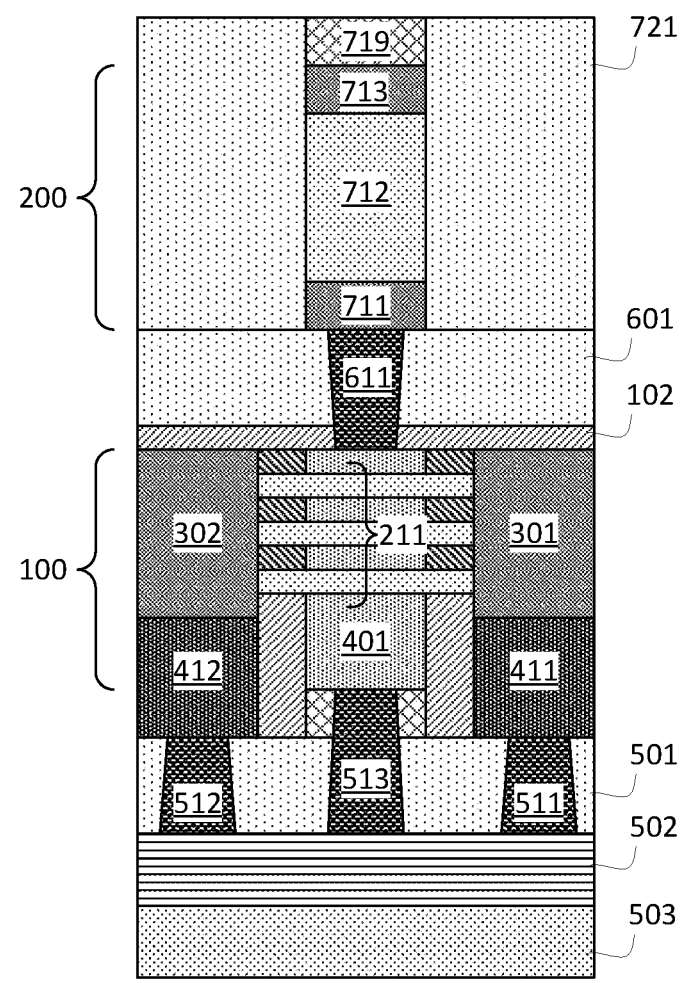

FIG. 7 is a demonstrative illustration of cross-sectional view of a semiconductor structure in a step of manufacturing thereof according to one embodiment of present invention. More specifically, following the step illustrated in FIG. 6, embodiments of present invention provide depositing a dielectric layer 721 on top of the dielectric layer 601 to surround the vertical transistor 200. More particularly, the dielectric layer 721 may be a layer of silicon-oxide (SiO$_2$) or silicon-nitride (SiN), and may surround the bottom source/drain 711, the channel region 712, and the top source/drain 713 of the vertical transistor 200. Following the deposition, a CMP process may be applied to planarize a top surface of the dielectric layer 721 until, for example, the hard mask 719 is exposed.

Figure 8:
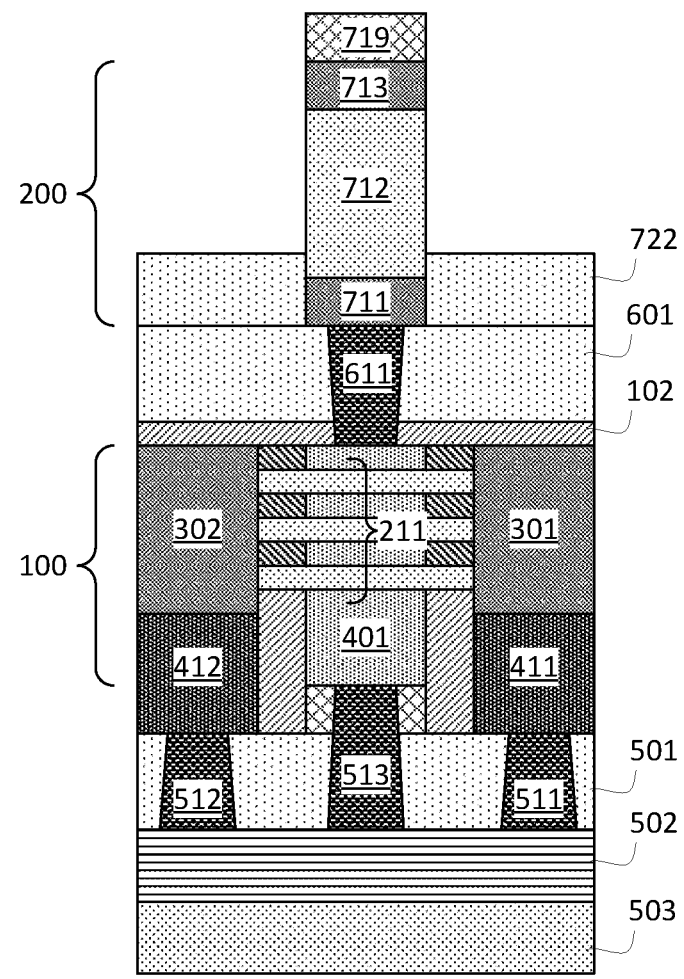

FIG. 8 is a demonstrative illustration of cross-sectional view of a semiconductor structure in a step of manufacturing thereof according to one embodiment of present invention. More specifically, following the step illustrated in FIG. 7, embodiments of present invention provide recessing the dielectric layer 721 to expose a majority of the channel region 712 of the vertical transistor 200. For example, the dielectric layer 721 may be reduced to become a dielectric layer 722, which has a height that is higher than a height of the bottom source/drain 711. In other words, the dielectric layer 721 may be recessed to expose the channel region 712 while the bottom source/drain 711 remains embedded in the resulting dielectric layer 722.

Figure 9:
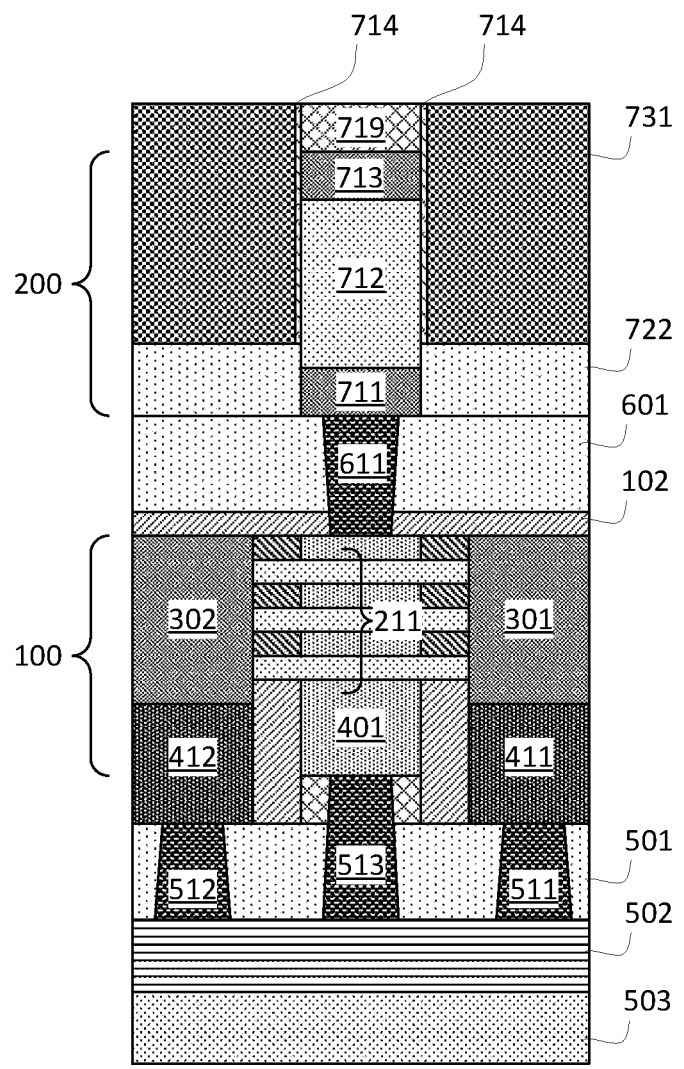

FIG. 9 is a demonstrative illustration of cross-sectional view of a semiconductor structure in a step of manufacturing thereof according to one embodiment of present invention. More specifically, following the step illustrated in FIG. 8, embodiments of present invention provide depositing a gate dielectric layer 714 covering exposed sidewalls of the channel region 712. Subsequently, a gate metal layer 731 may be formed to surround the channel region 712 and the gate dielectric layer 714. The gate metal layer 731 may include, for example, one or more work-function metals such as, for example, TiN, TaN, etc. and one or more metal layers such as, for example, W, Cu, etc.

Figure 10:
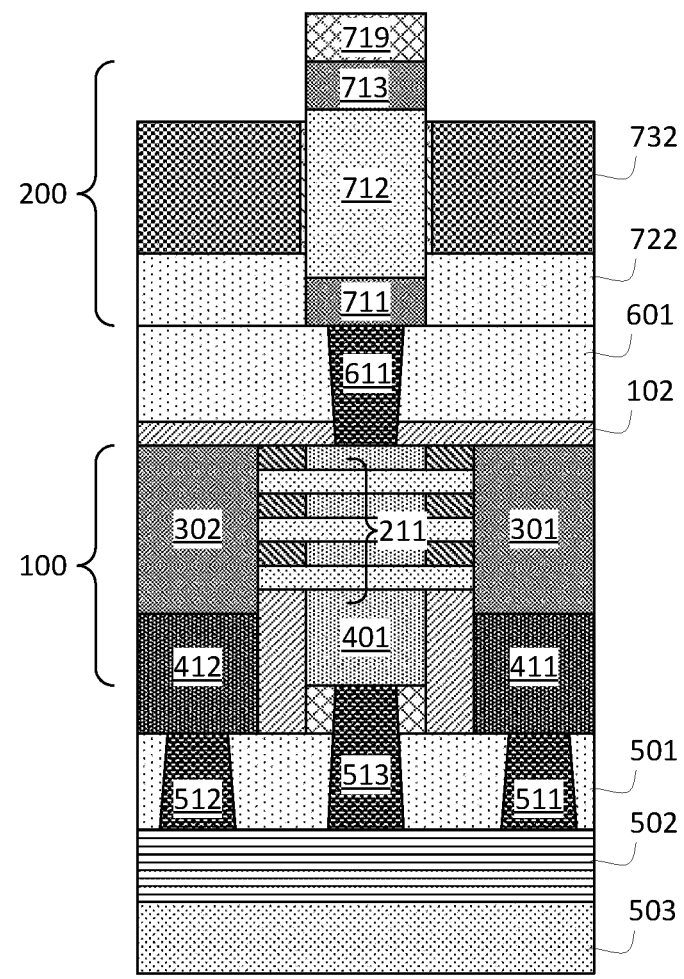

FIG. 10 is a demonstrative illustration of cross-sectional view of a semiconductor structure in a step of manufacturing thereof according to one embodiment of present invention. More specifically, following the step illustrated in FIG. 9, embodiments of present invention provide selectively recessing the gate dielectric layer 714 and the gate metal layer 731 relative to the top source/drain 713. The gate dielectric layer 714 and the gate metal layer 731 may be recessed to a level below a bottom surface of the top source/drain 713, thereby fully exposing the top source/drain 713. The recessing thereby creates a metal gate 732 that surrounds the channel region 712 of the vertical transistor 200 via the gate dielectric layer 714. In one embodiment, the metal gate 732 may have a sufficient height such as, for example, around 10 nm to 500 nm, so as to possess a sufficiently large capacitance for increased retention time as part of a DRAM device, as being described below in more details.

Figure 11:
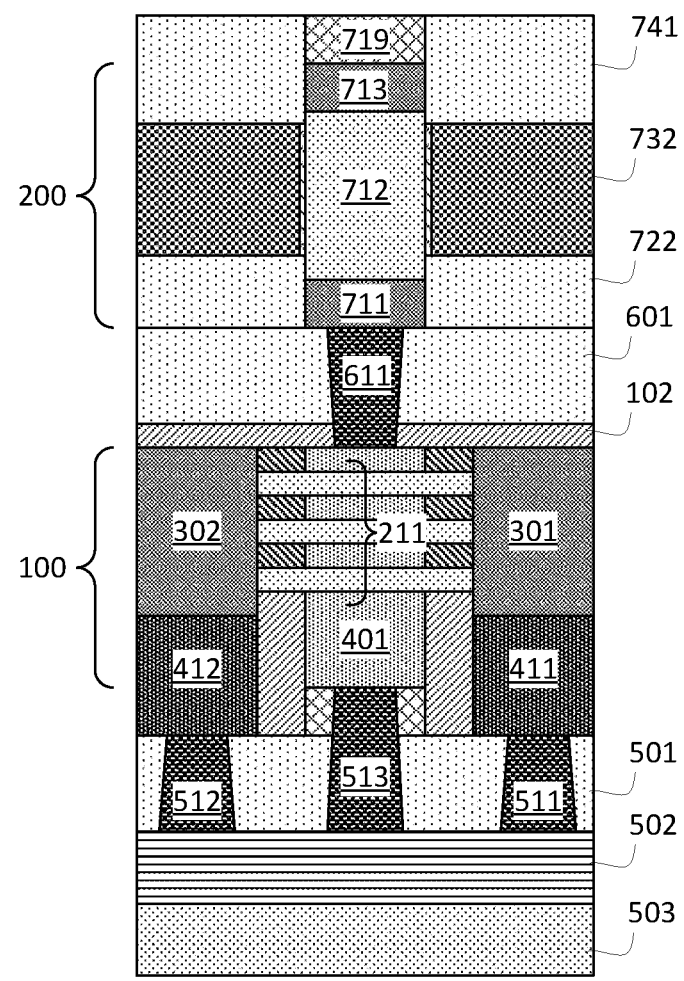

FIG. 11 is a demonstrative illustration of cross-sectional view of a semiconductor structure in a step of manufacturing thereof according to one embodiment of present invention. More specifically, following the step illustrated in FIG. 10, embodiments of present invention provide depositing a dielectric layer 741 on top of the metal gate 732 to surround the top source/drain 713 of the vertical transistor 200. The dielectric layer 741 may also surround the hard mask 719 on top of the top source/drain 713.

Figure 12:
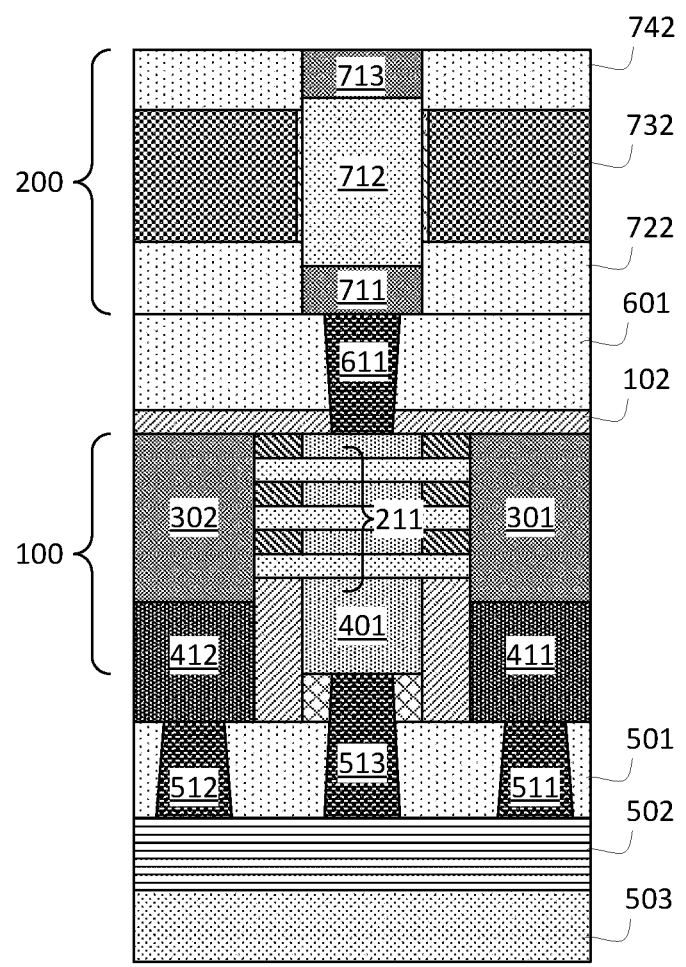

FIG. 12 is a demonstrative illustration of cross-sectional view of a semiconductor structure in a step of manufacturing thereof according to one embodiment of present invention. More specifically, following the step illustrated in FIG. 11, embodiments of present invention provide removing the hard mask 719 to expose the top source/drain 713 of the vertical transistor 200. For example, a CMP process may be applied to remove or polish off the hard mask 719, together with a top portion of the dielectric layer 741 until the top surface of the top source/drain 713 is exposed. The remaining portion of the dielectric layer 741 becomes a dielectric layer 742 that surrounds the top source/drain 713 and at least a portion of the channel region 712 of the vertical transistor 200.

Figure 13:
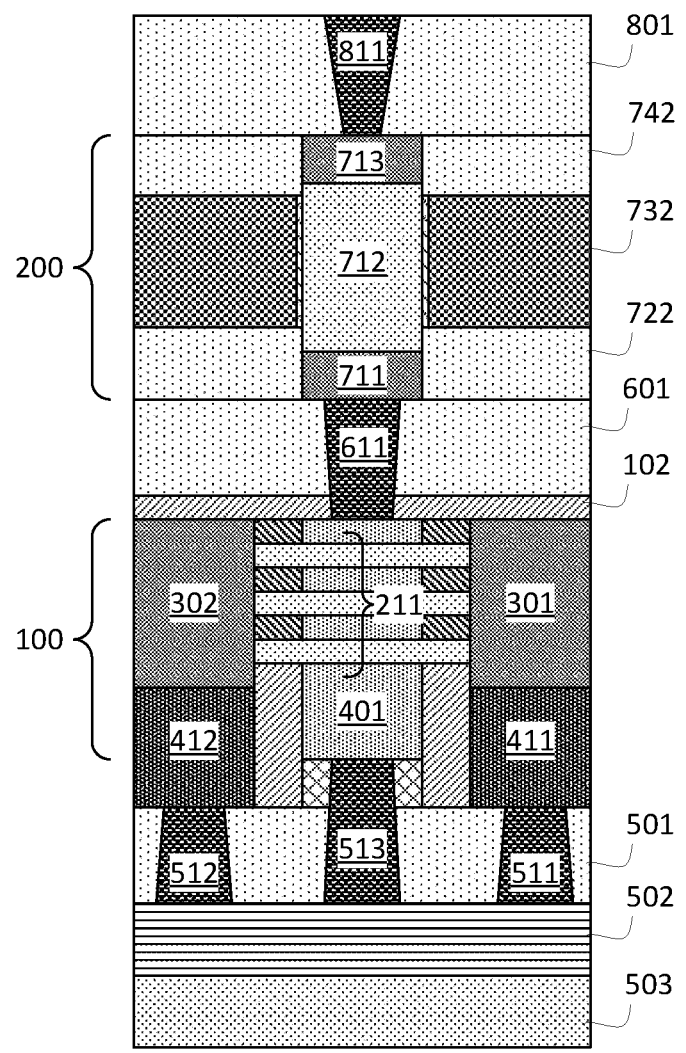

FIG. 13 is a demonstrative illustration of cross-sectional view of a semiconductor structure in a step of manufacturing thereof according to one embodiment of present invention. More specifically, following the step illustrated in FIG. 12, embodiments of present invention provide depositing a dielectric layer 801 on top of the dielectric layer 742 and on top of the top source/drain 713 of the vertical transistor 200; creating an opening in the dielectric layer 801 that exposes the top source/drain 713; and filling the opening with a conductive material to forma a conductive via 811 in contact with the top source/drain 713 of the vertical transistor 200.

Figure 14:
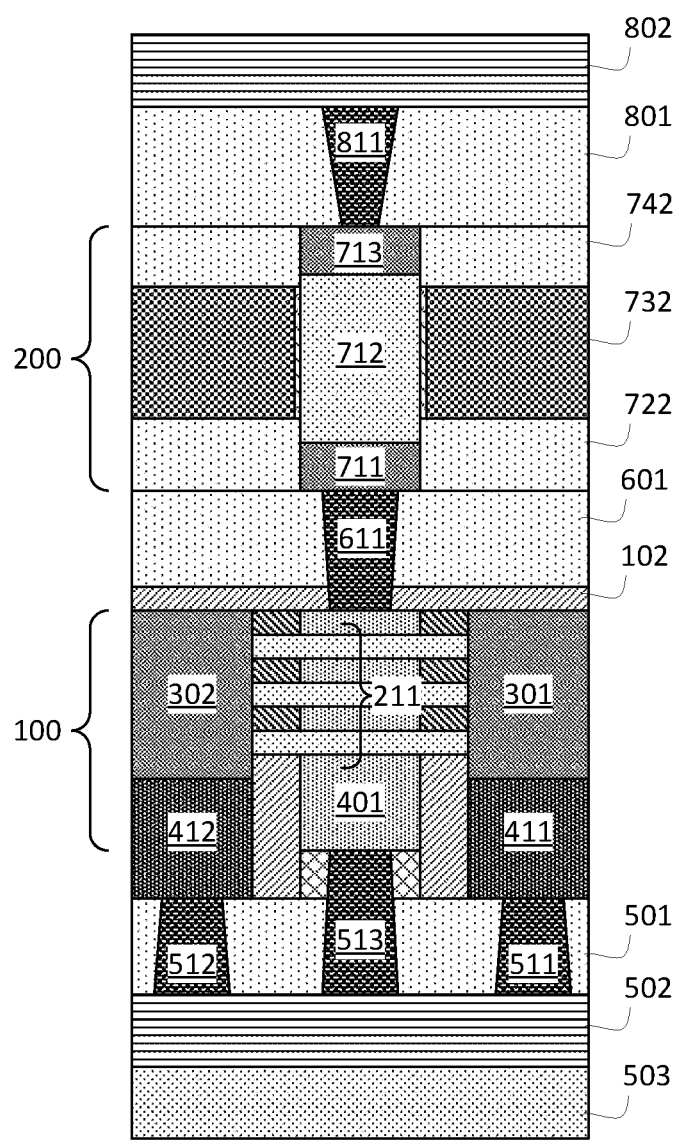

FIG. 14 is a demonstrative illustration of cross-sectional view of a semiconductor structure in a step of manufacturing thereof according to one embodiment of present invention. More specifically, following the step illustrated in FIG. 13, embodiments of present invention provide forming a backside interconnect 802 on top of the dielectric layer 801 and the conductive via 811. The backside interconnect 802 provide contact access to the top source/drain 713 and the metal gate 732 of the vertical transistor 200.

In one embodiment, the nanosheet transistor 100 and the vertical transistor 200 may together form a DRAM device. The vertical transistor 200 may be a write-transistor and the nanosheet transistor may be a read-transistor of the DRAM device. In one embodiment, the top source/drain 713 of the vertical transistor 200 may be connected to a write-bit-line (WBL) and the metal gate 732 of the vertical transistor 200 may be connected to a write-word-line (WWL). Both the WBL and the WWL may be provided by or come from the backside interconnect 802. In another embodiment, the first source/drain region 301 of the nanosheet transistor 100 may be connected to a read-bit-line (RBL) from the frontside interconnect 502, and the second source/drain 302 of the nanosheet transistor 100 may be grounded. Within the DRAM device, the bottom source/drain of the vertical transistor 200 is connected to the gate of the nanosheet transistor 100 to form a storage node (SN).

Figure 15:
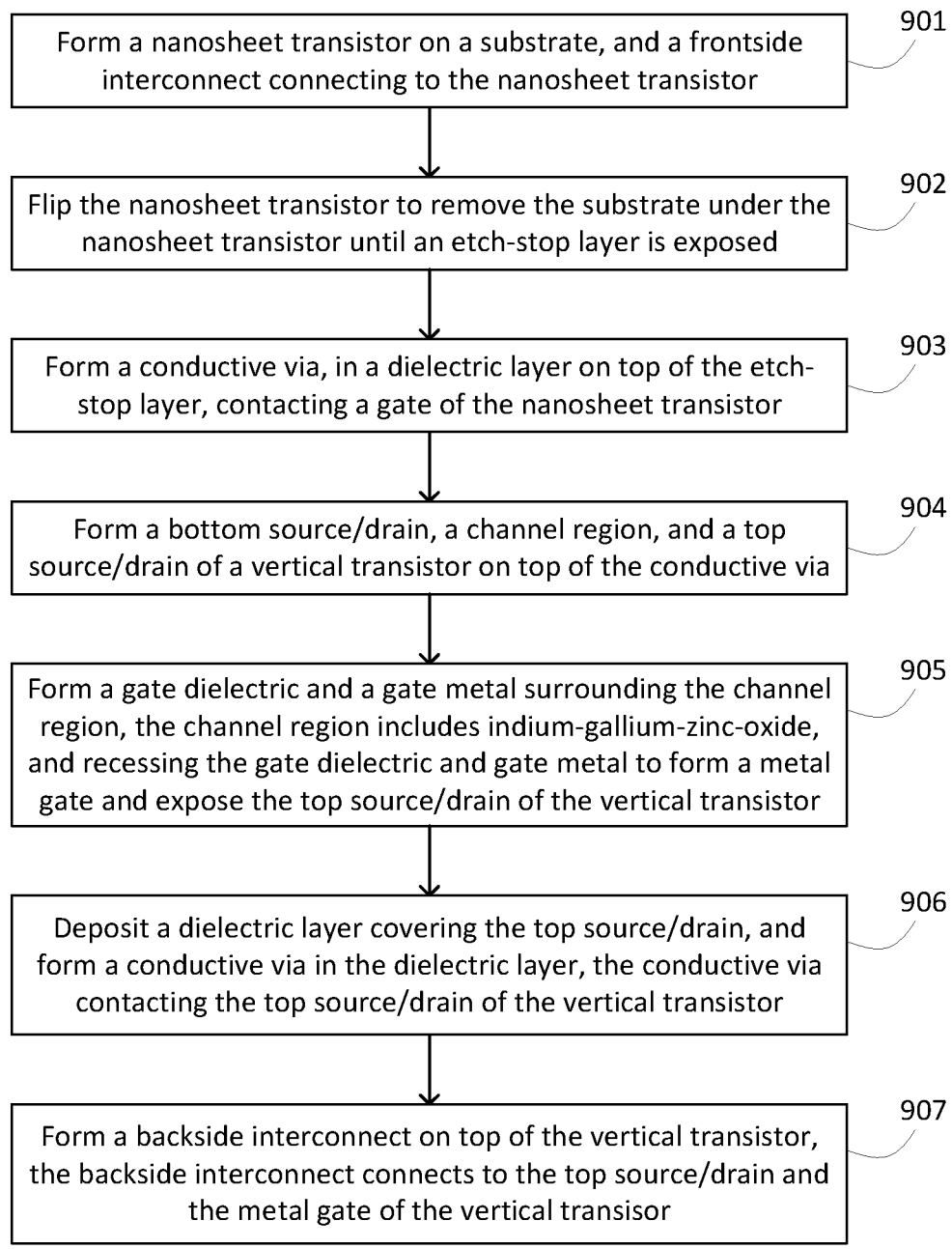
FIG. 15 is a demonstrative illustration of a flow-chart of a method of manufacturing a semiconductor structure according to embodiments of present invention.

FIG. 15 is a demonstrative illustration of a flow-chart of a method of manufacturing a semiconductor structure according to embodiments of present invention. The method includes (901) forming a nanosheet transistor on a substrate, and a frontside interconnect that connects to source/drain regions and gate of the nanosheet transistor; (902) flipping the nanosheet transistor upside-down to remove the substrate under the nanosheet transistor until an etch-stop layer is exposed; (903) forming a dielectric layer and a conductive via in the dielectric layer with the conductive via directly contacting a gate of the nanosheet transistor; (904) forming, vertically above the conductive via, a bottom source/drain, a channel region, and a top source/drain of a vertical transistor; (905) forming a gate dielectric layer surrounding the channel region and a gate metal surrounding the gate dielectric layer and the channel region, and subsequently recessing the gate dielectric layer and the gate metal to form a metal gate and expose the top source/drain region; (906) forming a dielectric layer covering the top source/drain and a conductive via in the dielectric layer contacting the top source/drain of the vertical transistor; and (907) form a backside interconnect on top of the vertical transistor, with the backside interconnect connected to the top source/drain and the metal gate of the vertical transistor.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions above have been presented for the purposes of illustration of various embodiments of present invention and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A memory device comprising:
a vertical transistor and a nanosheet transistor, the vertical transistor being stacked on top of the nanosheet transistor,
wherein a bottom source/drain of the vertical transistor is directly above and connected to a gate of the nanosheet transistor through a conductive via, and wherein a channel region of the vertical transistor comprises indium-gallium-zinc-oxide (IGZO).

2. The memory device of claim 1, wherein the IGZO in the channel region is horizontally surrounded by a metal gate via a layer of gate oxide.

3. The memory device of claim 2, wherein the channel region of the vertical transistor has a vertical length that is equal to or larger than 10 nm.

4. The memory device of claim 1, wherein the vertical transistor is a write-transistor and the nanosheet transistor is a read-transistor, and the write-transistor and the read-transistor form a dynamic random-access-memory (DRAM).

5. The memory device of claim 4, wherein a top source/drain of the vertical transistor is connected to a write-bit-line, and a gate of the vertical transistor is connected to a write-word-line.

6. The memory device of claim 1, wherein the nanosheet transistor has a dimension measured from a first source/drain region to a second source/drain region, and wherein a channel region of the vertical transistor is horizontally smaller than the dimension of the nanosheet transistor.

7. The memory device of claim 1, wherein the nanosheet transistor has three or more nanosheets.

8. A semiconductor structure comprising:
a dynamic random-access-memory (DRAM), the DRAM comprising:

a vertical transistor and a nanosheet transistor, the vertical transistor being stacked on top of the nanosheet transistor, wherein a bottom source/drain of the vertical transistor is directly above and connected to a gate of the nanosheet transistor through a conductive via; and a frontside interconnect underneath the nanosheet transistor and a backside interconnect above a top source/drain of the vertical transistor.

9. The semiconductor structure of claim 8, wherein a channel region of the vertical transistor comprises indium-gallium-zinc-oxide (IGZO).

10. The semiconductor structure of claim 9, wherein the IGZO in the channel region is horizontally surrounded by a metal gate via a layer of gate oxide.

11. The semiconductor structure of claim 9, wherein the vertical transistor is a write-transistor and the nanosheet transistor is a read-transistor of the DRAM.

12. The semiconductor structure of claim 11, wherein the top source/drain of the vertical transistor is connected to a write-bit-line and a gate of the vertical transistor is connected to a write-word-line, both the write-bit-line and the write-word-line being in the backside interconnect.

13. The semiconductor structure of claim 11, wherein a first source/drain of the nanosheet transistor is connected to a read-bit-line in the frontside interconnect, and a second source/drain of the nanosheet transistor is grounded.

14. A method of forming a semiconductor structure comprising:

forming a nanosheet transistor;

flipping the nanosheet transistor upside-down; and forming a vertical transistor on top of the nanosheet transistor, wherein a bottom source/drain of the vertical transistor is connected to a gate of the nanosheet transistor.

15. The method of claim 14, wherein forming the vertical transistor comprises:

removing a substrate upon which the nanosheet transistor is formed until an etch-stop layer is exposed;

depositing a dielectric layer on top of the etch-stop layer;

creating an opening in the dielectric layer and the etch-stop layer to expose the gate of the nanosheet transistor; and forming a conductive via in the opening to contact the gate of the nanosheet transistor.

16. The method of claim 15, wherein forming the vertical transistor further comprises:

forming a stack of layers on top of the dielectric layer and the conductive via; and patterning the stack of layers into the bottom source/drain, a channel region, and a top source/drain of the vertical transistor.

17. The method of claim 16, wherein forming the vertical transistor further comprises:

forming a gate dielectric horizontally surrounding the channel region; and forming a metal gate horizontally surrounding the channel region and the gate dielectric, wherein the channel region comprises indium-gallium-zinc-oxide (IGZO).

18. The method of claim 16, wherein patterning the stack of layers comprises forming the bottom source/drain, the channel region, and the top source/drain to have a horizontal dimension that is smaller than a dimension of the nanosheet transistor, the dimension of the nanosheet transistor being measured from a first source/drain region to a second source/drain region of the nanosheet transistor.

* * * * *